United States Patent [19]

Siegmund et al.

[11] 4,399,410
[45] Aug. 16, 1983

[54] CIRCUIT FOR GENERATING TWO PERIODIC SIGNALS HAVING A CONTROLLABLE PHASE RELATIONSHIP THEREBETWEEN

[75] Inventors: Gary G. Siegmund, Elyria; Robert J. Kretschmann, Bay Village, both of Ohio

[73] Assignee: Reliance Electric Co., Cleveland, Ohio

[21] Appl. No.: 291,455

[22] Filed: Aug. 10, 1981

[51] Int. Cl.³ .............................................. H03K 5/153
[52] U.S. Cl. ...................................... 328/55; 328/155; 307/262
[58] Field of Search ........................... 328/55, 57, 155; 307/262, 511

[56] References Cited

U.S. PATENT DOCUMENTS 3,382,379  5/1968  Lawless ............................... 307/262
3,601,708  8/1971  Stempler et al. ..................... 328/155
4,137,503  1/1979  Ziesmer ................................ 328/55

Primary Examiner—John S. Heyman
Attorney, Agent, or Firm—Michael M. Rickin

[57] ABSTRACT

A circuit for generating at least two periodic output signals having a phase relationship controllable between zero and 180 degrees as a function of a d.c. control signal as compared to a ramp signal. Also included is circuitry for controlling the phase relationship to be at substantially 180 degrees when the d.c. control signal is always greater than the ramp signal and to be at substantially zero degrees when the d.c. control signal is always less than the ramp signal.

19 Claims, 5 Drawing Figures

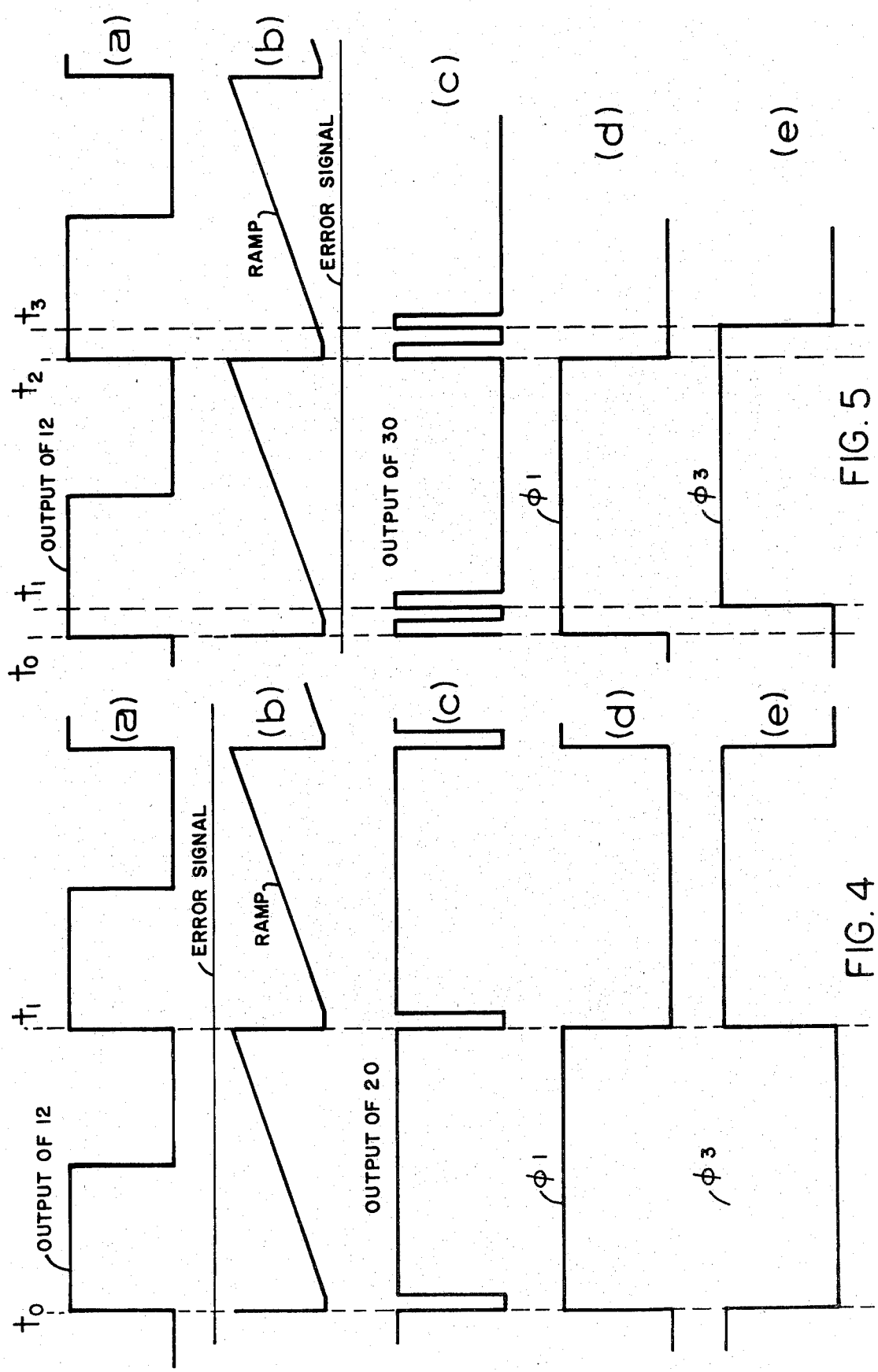

CIRCUIT FOR GENERATING TWO PERIODIC SIGNALS HAVING A CONTROLLABLE PHASE RELATIONSHIP THEREBETWEEN

CROSS REFERENCE TO RELATED APPLICATIONS

Of interest is the following copending application Ser. No. 291,454 also entitled "Circuit for Generating Two Periodic Signals having a Controllable Phase Relationship Therebetween" which is filed on even date herewith, is based on the invention of Dustin J. Becker and is assigned to the same assignee as the present application.

BACKGROUND OF THE INVENTION

1. Field of the Invention

The present invention relates to a circuit for generating two periodic signals having a controlled phase relationship and more particularly to circuitry which generates the two periodic signals with a phase relationship of from zero to 180 degrees, which phase is dependent on the amplitude of a d.c. control signal.

2. Description of the Prior Art

In many control systems an output parameter such as voltage, current or power is controlled by controlling the displacement angle between a primary waveform and a phase shifted version of the primary wave. The displacement angle may fluctuate anywhere from zero degrees to 180 degrees. Various techniques have been developed in the prior art for controlling this displacement angle. One such prior art technique is the use of a phase-locked loop.

The phase-locked loop system locks two oscillators into frequency synchronization and controls the phase angle between them by manipulating the phase detector parameters. The phase-locked loop system is, however, subject to problems. These problems arise as a result of instabilities in the control loop and difficulties in the operation of the capture and track modes of the phase-locked loop. When used as part of a larger control system these problems may make the larger system extremely difficult to stabilize.

The circuit of the present invention allows the phase angle between the main output and the phase shifted version thereof to vary in a controllable manner between zero degrees and 180 degrees without any of the stability problems associated with the previously described phase-locked loop system.

SUMMARY OF THE INVENTION

According to the present invention there is provided a circuit which generates as a function of a d.c. control signal at least two periodic output signals having a phase relationship controllable between zero and 180 degrees. The circuit includes an oscillator for generating a periodic signal having a first portion of one amplitude and a second portion of other amplitude. Means are included to generate in response to the oscillator signal a signal having a ramp waveform with the ramp starting each time the oscillator signal first portion begins. A comparator compares the ramp signal to a d.c. control signal and generates a signal having a first amplitude when the control signal exceeds the ramp and a second amplitude when the ramp exceeds the control signal. In response to the oscillator signal a first output means generates one of the output signals. Means are included to generate a delayed version of the first output signal. A second output means generates the other of the output signals in response to the signals generated by the delay means and the comparator means when the comparator signal changes in amplitude from the first to second amplitude.

DESCRIPTION OF THE DRAWING

FIG. 4 are the waveforms associated with the present invention when the phase relationship between the two periodic output signals is controlled to be at 180 degrees.

FIG. 5 are the waveforms associated with the present invention when the phase relationship between the two periodic output signals is controlled to be at substantially zero degrees.

DESCRIPTION OF THE PREFERRED EMBODIMENT

Figure 1:
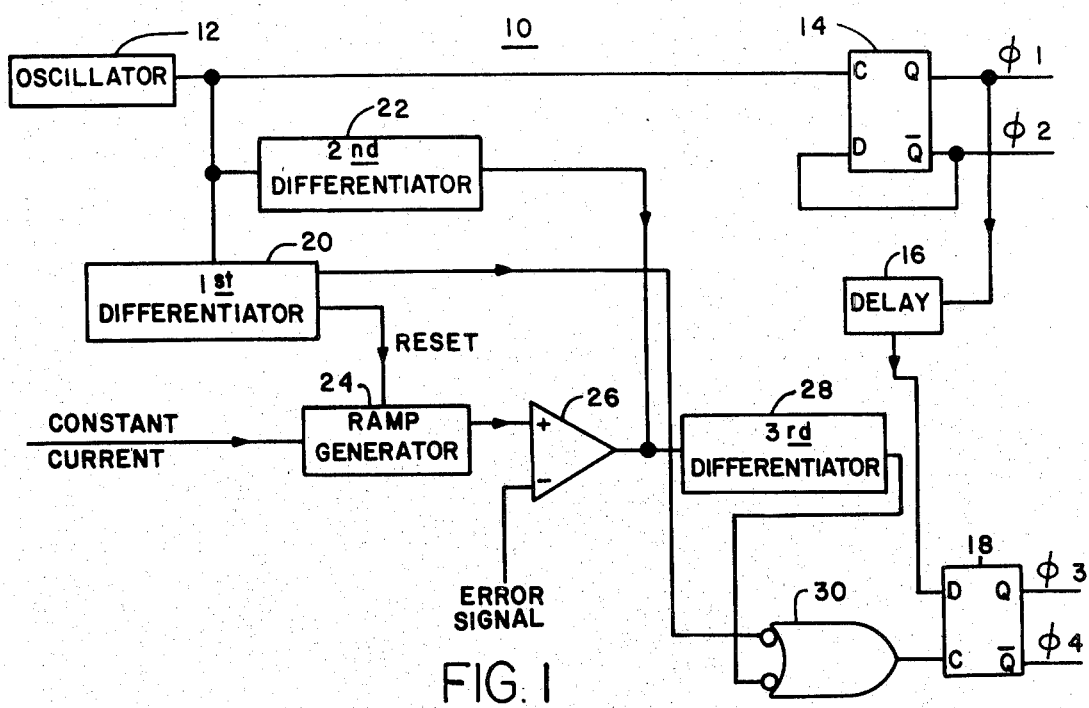
FIG. 1 is a block-schematic diagram illustrating one embodiment of the present invention.

Referring to FIG. 1 there is shown a circuit 10 for generating in response to a d.c. control or error signal at least two square waves having a controllable phase relationship therebetween. The phase relationship between the square waves is controlled as a function of the magnitude of the error signal.

An oscillator 12 generates a square wave having a predetermined frequency which may, for example, be in the order of 20 KHz. The square wave generated by oscillator 12 is connected to the clock (C) input of D type flip-flop 14. The D input of the flip-flop is connected to the flip-flop's $\overline{Q}$ output. This connection insures that each time the output of oscillator 12 goes positive the flip-flop 14 changes its state. Thus, the output signals of flip-flop 14, designated in FIG. 1 as $\phi_1$ and $\phi_2$, are square waves which are 180 degrees out of phase with respect to each other and are at half of the frequency of the square wave generated by oscillator 12.

The Q output of flip-flop 14 is connected by delay network 16 to the D input of flip-flop 18. Delay network 16 may, for example, be comprised of the series combination of a resistor connected between the Q output of flip-flop 14 and the D input of flip-flop 18 and a capacitor connected between the D input of flip-flop 18 and ground. The $\phi_1$ square wave therefore appears after a short delay at the D input of flip-flop 18. The output signals of flip-flop 18 at the Q and $\overline{Q}$ terminals are designated in FIG. 1 as $\phi_3$ and $\phi_4$, respectively. Circuit 10 functions to maintain a controlled phase relationship between the $\phi_1$ square wave of flip-flop 14 and the $\phi_3$ square wave of flip-flop 18 which relationship may be controlled to include any phase angle between zero and 180 degrees. The same controlled phase relationship also exists between the flip-flops' $\phi_2$ and $\phi_4$ square waves.

Figure 2:
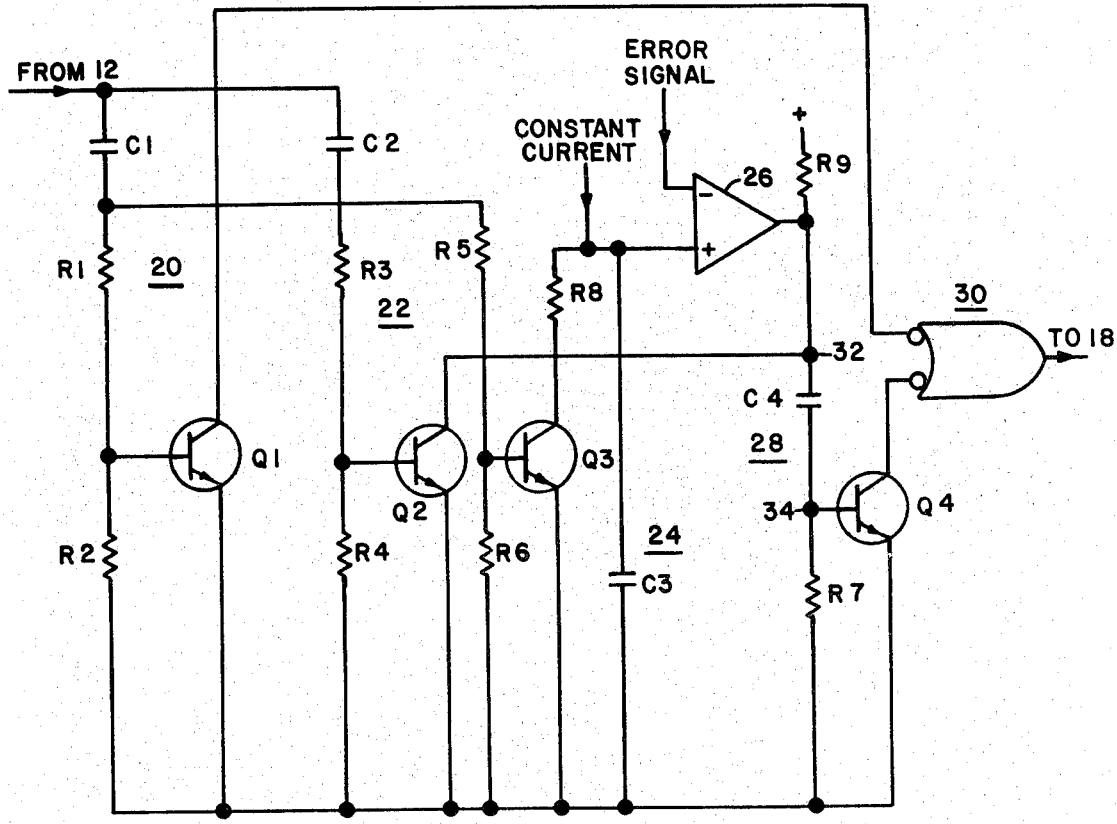
FIG. 2 is a schematic diagram of the first, second and third differentiators and the ramp generator shown in FIG. 1.

The square wave generated by oscillator 12 is also connected as an input signal to a first differentiator 20 and a second differentiator 22. Each of differentiators 20 and 22 are arranged to generate negative-going pulses of narrow width each time the oscillator signal undergoes a positive transition. Differentiators 20 and 22, detailed circuit schematics for which are shown in FIG. 2 to be described hereinafter, are designed such that the pulses generated by differentiator 22 are wider in time than the pulses generated by differentiator 20. The pulses generated by differentiators 20 and 22, however, both start upon the positive-going transition of the oscillator square wave. Differentiator 20 has two outputs, one of which is connected as the reset input to ramp generator 24 and the other of which is connected as one input to two input OR gate 30. Differentiator 22 has one output which is connected to the input of a third differentiator 28.

Ramp generator 24 functions to generate a ramp signal of positive slope with a period equal to the period of the square wave generated by oscillator 12. To generate this ramp signal circuit 74 receives from a current source (not shown) a constant current. The period of the ramp signal is controlled by the time of occurrence of the reset pulse generated by differentiator 20 which, as described above, occurs at each positive-going transition of the signal generated by oscillator 12. Thus, the output of ramp generator 24 is a ramp signal of positive slope having a period equal to the period of the signal generated by oscillator 12.

The ramp signal appears on the noninverting input of a comparator 26. The inverting input of comparator 26 receives a d.c. error control signal. Circuit 10 is typically used in the feedback loop of a system to maintain control over one or more of the system's output parameters. The output signals generated by circuit 10 are then used to control those system elements which regulate the output parameter which is under control. To maintain regulation the output parameter under control is measured against a predetermined value of such parameter thereby giving rise to a d.c. error signal which represents the amount by which the output varies from the predetermined value. It is this d.c. error signal which then appears on the inverting input of comparator 26.

Comparator 26 generates at its output a waveform having positive and negative portions of variable width and a period equal to the period of the square wave generated by oscillator 12. The width of the waveform's positive and negative portions is dependent on the amplitude of the d.c. error signal relative to the amplitude of the ramp generator signal. When the amplitude of the error signal is such as to intercept the ramp signal the waveform generated by comparator 26 will be positive for those portions of the ramp signal which are higher in amplitude than the error signal and negative for those portions of the ramp signal which are lower in amplitude than the error signal. As described above, the amplitude of the error signal is dependent on the amplitude of the system output parameter which is being controlled by the output signals of circuit 10. As the amplitude of the error signal changes, the positive and negative portions of the waveform generated by comparator 26 change in accordance with the portion of the ramp signal intercepted by the error signal.

The waveform generated by comparator 26 appears as one input to a third differentiator 28. Each time the waveform of comparator 26 undergoes a positive-going transition, a negative pulse is generated by differentiator 28. The negative pulse is connected to one input of two input OR gate 30 to thereby provide the clock signal to flip-flop 18. As the waveform generated by circuit 26 goes positive whenever the ramp signal exceeds the amplitude of the error signal, flip-flop 18 is therefore clocked at that instant of time. The state to which the flip-flop is clocked depends on polarity of the signal at its D input. This signal is the $\phi_1$ output signal of flip-flop 14 and apears at the D input after the delay introduced by circuit 16. The $\phi_1$ and $\phi_3$; $\phi_2$ and $\phi_4$ output signals of flip-flops 14 and 18 therefore have a phase relationship which depends upon the time of occurrence of the clock signal to flip-flop 18 relative to the time at which the oscillator square wave underwent a positive transition. Thus, circuit 10 generates square waves whose phase relationship is controlled as a function of the amplitude of an error signal relative to the amplitude of a ramp signal.

There are, however, two conditions of the system output parameter under control which require that the phasing between the $\phi_1$ and $\phi_3$ or $\phi_2$ and $\phi_4$ signals be maintained either at 180 degrees or zero degrees. One such condition occurs when the amplitude of the error signal is sufficiently positive so that no portion of the ramp signal is intercepted. Such a condition may occur where the system output parameter under control is either at or very close to zero amplitude. For example, circuit 10 may be used in a power supply to control the conduction time of semi-conductor elements to thereby regulate the supply's output voltage. The condition of the error signal being more positive than the ramp signal may occur when the supply's output power is zero. Under that condition it would be desirable for the square waves generated by flip-flops 14 and 18 to have a 180 degrees phase relationship therebetween. The other such condition occurs where the amplitude of the error signal is so low that again no portion of the ramp signal is intercepted. For the use of circuit 10 in a power supply, this condition may occur when the supply's output power is at its maximum value. Under that condition it would be desirable for the square waves generated by flip-flops 14 and 18 to have a zero degree phase relationship maintained therebetween.

For the first condition the output signal generated by comparator 26 is always negative. As will be described in more detail in connection with FIG. 2, wherein circuit schematics for differentiators 20, 22 and 28 and ramp generator 24 are shown, the outputs of comparator 26 and differentiator 22 are in effect OR'd before appearing at the input to differentiator 28. The OR functions such that when the output of comparator 26 is negative the input to differentiator 28 will also be negative independent of the pulse generated by differentiator 22. The input to differentiator 28 does not for this condition undergo the transition needed to generate a clock pulse for flip-flop 18. Another source of clock pulses for the flip-flop must be used.

The 180 degrees phase relationship between the outputs of flip-flops 14 and 18 is maintained by the direct connection of the pulse generated by differentiator 20 to the other input of gate 30. It is this connection which provides the pulse to thereby clock flip-flop 18. The state to which the flip-flop clocks is dependent on the polarity of the signal at its D input. In order to maintain the desired 180 degree phase relationship between the $\phi_1$ and $\phi_3$ outputs, the signal at the D input must be of a polarity which reflects the previous state of flip-flop 14. Differentiator 20 generates a negative pulse each time oscillator 12 undergoes a positive transition. Gate 30 converts the negative pulse to a positive pulse whose positive-going transition (leading edge) is used to clock flip-flop 18. The above desired result of having flip-flop 18 follow the previous state of flip-flop 14 is therefore accomplished by having delay 16 be of sufficient length so that the change in state of flip-flop 14 is delayed in appearing at the D input to flip-flop 18 until the positive-going transition of the pulse from gate 30 has passed. Therefore, under this first condition flip-flop 18 is clocked to follow the previous and not the new state of flip-flop 14. Thus for this condition, the $\phi_3$ output of flip-flop 18 will always lag the $\phi_1$ output of flip-flop 14 by 180 degrees.

For the second condition the amplitude of the ramp signal is well above the amplitude of the d.c. error signal and the output of comparator 26 is always positive. The OR connection between the output of comparator 26 and differentiator 22 allows the negative-going pulse generated by differentiator 22 to appear at the input to differentiator 28. It is this negative-going pulse which is used by differentiator 28 to provide the clock signal for flip-flop 18 under this condition.

As described previously, the pulse generated by differentiator 22 is longer in time than both the pulse generated by differentiator 20 and the delay 16 between the $\phi_1$ output signal of flip-flop 14 and the appearance of that signal at the D input of flip-flop 18. The clocking pulse for flip-flop 18 is generated by differentiator 28 upon the positive-going transition of the negative pulse generated by differentiator 22. The clock pulse is therefore generated in time after the D input of flip-flop 18 has changed its polarity to reflect the change in state of flip-flop 14 caused by the clock pulse from oscillator 12. Flip-flop 18 is therefore clocked to follow the change in state of flip-flop 14. For this second condition a substantially zero degree phase relationship is maintained between the $\phi_1$ and $\phi_3$ output signals of flip-flops 14 and 18. It should be appreciated that the pulse generated by differentiator 20 does appear after inversion by gate 30 at the C input of flip-flop 18. This pulse does not, however, change the state of the flip-flop as the D input of the flip-flop does not change its state until after the delay of circuit 16. Thus, circuit 10 allows a controllable zero to 180 degree phase relationship to be maintained between square waves to thereby affect control of a system parameter.

Figure 3:
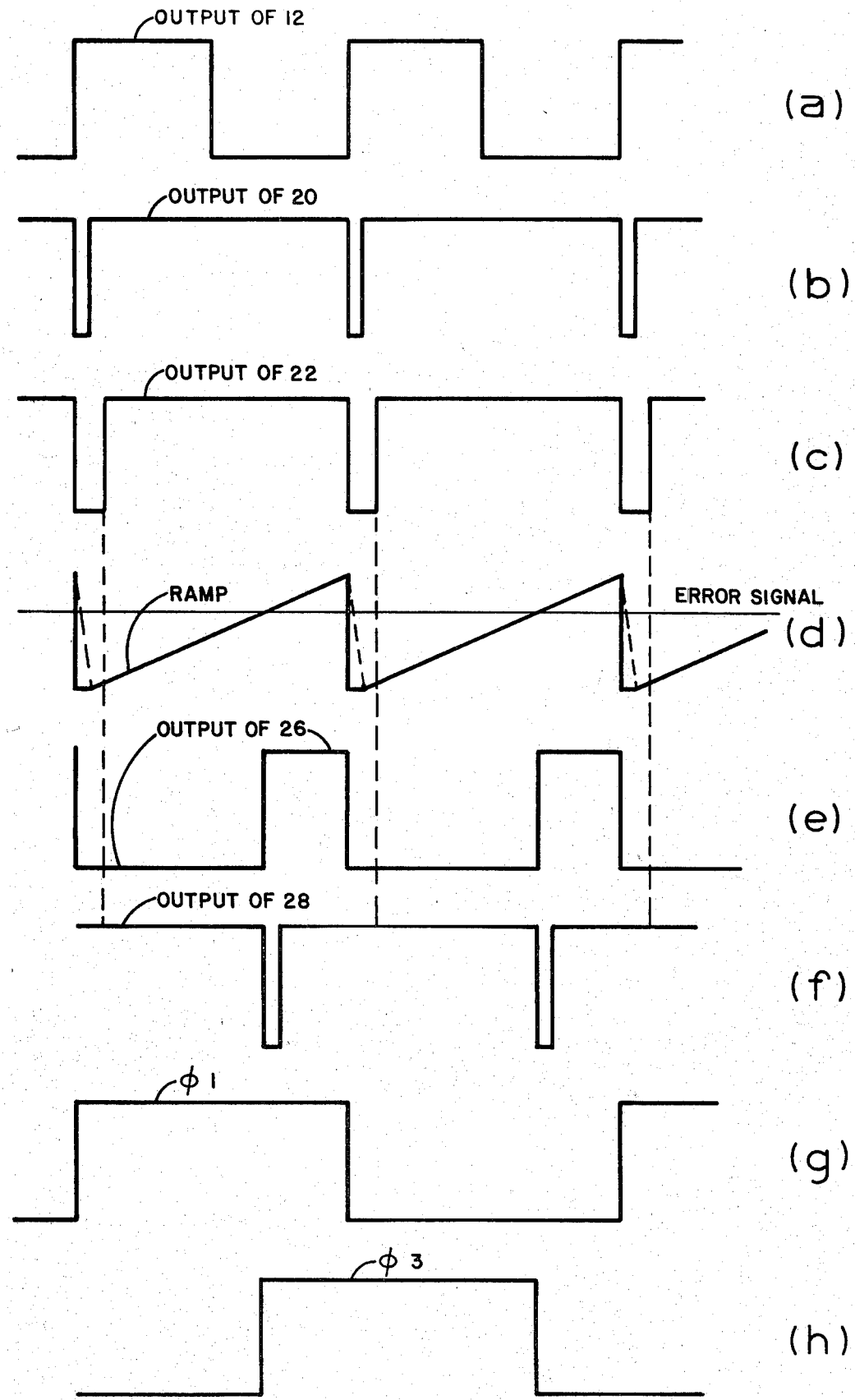
FIG. 3 are the waveforms associated with the present invention when the phase relationship between the two periodic output signals is controlled to fall between zero and 180 degrees.

The operation of circuit 10 will now be described in detail with reference to the circuit schematics shown in FIG. 2 and the waveforms shown in FIGS. 3, 4 and 5. FIG. 2 shows detailed circuit schematics for differentiators 20, 22 and 28 and ramp generator 24 of FIG. 1. FIG. 3 shows the waveforms associated with the differentiators, the ramp generator and the comparator when the error signal intercepts the ramp, whereas FIGS. 4 and 5 show waveforms for the circuit when the error signal is above and below the ramp, respectively.

Referring now to FIG. 2, there is shown detailed circuit schematics for differentiators 20 and 22 each of which are connected to receive the square wave generated by oscillator 12. This square wave is shown in FIG. 3a. In response to each positive-going transition of the square wave, differentiator 20 generates the negative-going pulses shown in FIG. 3b. To generate such pulses differentiator 20 includes a capacitor $C_1$ which has one end connected to receive the oscillator's square wave signal. The other end of the capacitor is connected to a first resistive network which comprises the series combination of resistors $R_1$ and $R_2$ and to a second resistive network which comprises the series combination of resistors $R_5$ and $R_6$. The midpoint of the series combination of resistors $R_1$ and $R_2$ is in turn connected to the base of a transistor $Q_1$ whereas the midpoint of the series combination of resistors $R_5$ and $R_6$ is connected to the base of a transistor $Q_3$. The combination of capacitor $C_1$ and the first and second resistive networks provides at the collectors of transistors $Q_1$ and $Q_3$ a narrow negative-going pulse each time the oscillator signal undergoes a positive transition. The negative-going pulse appearing on the collector of transistor $Q_1$ is connected directly to one input of OR gate 30 whereas the negative-going pulse generated at the collector of transistor $Q_3$ is connected as one input to ramp generator 24. Thus, differentiator 20 generates the negative-going pulses shown in FIG. 3b.

Differentiator 22 includes the combination of a capacitor $C_2$ having one end connected to the signal generated by oscillator 12 and the other end connected to the series combination of resistors $R_3$ and $R_4$. The midpoint of the resistor combination is connected to the base of a transistor $Q_2$. A negative-going pulse (shown in FIG. 3c) will therefore appear at the collector of $Q_2$ each time the oscillator signal undergoes a positive transition. This pulse is connected as one input to differentiator 28. As shown in FIGS. 3b and 3c, the negative-going pulses generated by differentiators 20 and 22 are identical with the exception that the pulse generated by differentiator 22 is longer in duration than the pulse generated by differentiator 20. A longer duration pulse may be obtained from differentiator 22 by properly selecting the resistances of each of the resistors used in differentiators 20 and 22.

Ramp generator 24 is comprised of a capacitor $C_3$ having one end connected between the collector of transistor $Q_3$ and the noninverting input of comparator 26. The other end of the capacitor is connected to signal ground. The capacitor receives a constant current to thereby generate the ramp signal shown in FIG. 3d. The ramp signal has a period equal to the period of the oscillator signal and starts each time the oscillator signal undergoes a positive transition. More specifically, each time the oscillator signal undergoes a positive transition, transistor $Q_3$ conducts to thereby discharge capacitor $C_3$. Transistor $Q_3$ conducts for the period of time equivalent to the width of the negative-going pulses shown in FIG. 3b.

During the period of time that transistor $Q_3$ conducts, the output of the ramp generator 24 is not a linear increasing waveform. In reality the actual waveform may have either the flat portion shown in FIG. 3d and/or a nonzero fall time. In FIG. 3d it has been assumed that upon the conduction of transistor $Q_3$ the capacitor is shorted and discharges instantaneously and thereafter remains shorted for the period of time during which the transistor conducts. It should be appreciated that upon the conduction of transistor $Q_3$ the voltage across the capacitor may not fall instantaneously and the ramp waveform may lock as shown by the dotted lines in FIG. 3d. A resistor $R_8$ may be included in the collector of transistor $Q_3$ in order to control the rate of discharge of the capacitor and therefore the slope of the dotted line. In any event, as the negative-going pulses generated by differentiator 20 are narrow as compared to the period of the square wave generated by oscillator 12, the transition region of the ramp signal between the end of one period and the beginning of the next is quite short and has substantially no effect upon the operation of circuit 10.

Also shown in FIG. 3d is the error signal which, for purposes of description, has been shown to intercept the ramp signal at some point during its period. The operation of FIG. 2 will first be described for the interception condition shown in FIG. 3d and will then be described for the conditions shown in FIGS. 4 and 5 wherein the amplitude of the ramp signal is less than and greater than the error signal amplitude, respectively.

The error signal appears as the inverting input of comparator 26. The comparator output comprises an open collector transistor which conducts as long as the amplitude of the ramp signal is below the amplitude of the error signal. Therefore, until such time as the ramp signal linearly increases in amplitude to become equal to the error signal, the output of the comparator as shown in FIG. 3e is negative. For that portion of the period of the ramp signal in which its amplitude exceeds that of the error signal, the transistor in comparator 26 turns off and the output of the comparator becomes, as shown in FIG. 3e, positive. Therefore, as shown in FIG. 3e, the output of the comparator is a waveform having a period equal to the period of the square wave generated by oscillator 12 but wherein the positive and negative portions have durations determinable by the intersection of the ramp signal and the error signal.

Circuit 10 also includes a third differentiator 28 which is comprised of a capacitor $C_4$, a resistor $R_7$ and a transistor $Q_4$. One end of capacitor $C_4$ is connected at junction 32 to the outputs of comparator 26 and second differentiator 22. Resistor $R_7$ is connected to signal ground and at junction 34 to the other end of capacitor $C_4$. Junction 34 is in turn connected to the base of transistor $Q_4$, the collector of which is connected to one input of OR gate 30.

Differentiator 28 responds to positive-going transitions to generate negative pulses of narrow width at the collector of transistor $Q_4$. The negative pulse which differentiator 22 generates each time the output of oscillator 12 undergoes a positive transition has a positive-going transistion at its trailing edge. Differentiator 28 does not, however, respond to this transition as long as the output of comparator 26 remains negative. The reason for the nonresponsiveness of the differentiator is the open collector transistor contained in comparator 26. When the output of the comparator is negative, the transistor is conducting and junction 32 acts as a virtual OR gate to keep the negative-going pulse generated by differentiator 22 from appearing at the input of differentiator 28. As long as the output of comparator 26 is negative the input to differentiator 28 remains negative independent of the output of differentiator 22. When the output of the comparator becomes positive, the input to differentiator 28 sees a positive-going transition (the negative pulse generated by differentiator 22 has long since disappeared) and in response thereto generates the negative-going pulse shown in FIG. 3f. Thus, for the interception condition differentiator 28 responds only to the change in polarity of the comparator and not to the pulse generated by differentiator 22.

The pulse generated by differentiator 28 appears as one input signal to OR gate 30. The other input to the OR gate is connected to receive the negative-going pulse generated by differentiator 20. Gate 30 therefore generates during each oscillator period two output pulses, one of which corresponds to the pulse generated by differentiator 20 and the other of which corresponds to the pulse generated by differentiator 28. The output of the OR gate is used to clock flip-flop 18. The Q output of flip-flop 14 is, as described previously in FIG. 1, connected by delay 16 to the D input of flip-flop 18. The Q outputs of flip-flops 14 and 18 are shown in FIGS. 3g and 3h, respectively. Flip-flop 14 changes state each time the oscillator output signal undergoes a positive transition. This change in state is, however, delayed by circuit 16 from appearing at the D input to flip-flop 18. Therefore, the pulse from gate 30 which corresponds to the pulse generated by differentiator 20 has no effect whatsoever on the state of flip-flop 18. It is the output pulse generated by differentiator 28 which is used to change the state of flip-flop 18. The outputs of flip-flops 14 and 18 therefore have a phase relationship which is controlled as a function of the relative amplitudes of the ramp and error signals.

Referring to FIG. 4b there is shown the ramp waveform and the error signal for that condition in which the error signal is greater in amplitude than the ramp waveform. The output of oscillator 12 is shown in FIG. 4a. For this condition the output of comparator 26 does not change in polarity and is always negative. The input to differentiator 28 is therefore always negative, and the differentiator is usable to supply the clock pulse to flip-flop 18. It is, however, desired that the $\phi_3$ output signal of flip-flop 18 be maintained 180 degrees out of phase with respect to the $\phi_1$ output signal of flip-flop 14. As differentiator 28 is usable to supply the clock pulse, an alternative source of clock pulses must be used. The clock pulse to maintain the 180 degree phase relationship between the outputs of flip-flops 14 and 18 is supplied from the collector of transistor $Q_1$. This pulse, as shown in FIG. 4c, occurs each time the oscillator output signal undergoes a positive transition.

Assume just prior to the time designated as $t_0$ in FIG. 4 that flip-flop 14 is reset and flip-flop 18 is set. At $t_0$ the oscillator output undergoes a positive transition and differentiator 20 generates the negative-going pulse shown in FIG. 4c. The oscillator's positive-going transition clocks flip-flop 14 set. The change in polarity of the flip-flop's Q output does not immediately appear at the D input to flip-flop 18. As flip-flop 14 was previously reset, the D input of flip-flop 18 is low and remains low for the additional period of time represented by delay 16. The pulse generated by differentiator 20 therefore clocks flip-flop 18 reset. As flip-flop 14 sets, flip-flop 18 is clocked reset. The $\phi_1$ and $\phi_3$ output signals of the flip-flops are therefore maintained 180 degrees out of phase with respect to each other.

After delay 16 times out, the D input of flip-flop 18 goes positive. Upon the generation of the next positive-going transition by oscillator 12 at the time designated as $t_1$ in FIG. 4, flip-flop 14 is clocked reset and flip-flop 18 is clocked set. The $\phi_1$ and $\phi_3$ output signals of the flip-flops are shown in FIGS. 4d and 4e, respectively. Thus, for the condition wherein the error signal is greater in amplitude than the ramp signal, differentiator 20 functions to clock flip-flop 18 to follow the prior state of flip-flop 14 and thereby maintain a 180 degree phase relationship between the $Q_1/Q_3$ and $Q_2/Q_4$ outputs of the flip-flops.

Referring to FIG. 5b there is shown the ramp waveform and the error signal for that condition in which the ramp signal is greater in amplitude than the error signal. The output of oscillator 12 is shown in FIG. 5a. For this condition the output of comparator 26 does not change polarity and is always positive. It is desired that the $\phi_3$ output signal of flip-flop 18 be maintained zero degrees out of phase with respect to the $\phi_1$ output signal of flip-flop 14. As the output of the comparator is always positive, the virtual OR gate at junction 32 allows the negative pulse generated by differentiator 22 each time the oscillator signal undergoes a positive transition to appear at the input of differentiator 28. This pulse is shown in FIG. 3c. In response to the trailing edge of this pulse, differentiator 28 generates a negative pulse which appears at one input of gate 30. It is this pulse which clocks flip-flop 18 to maintain the desired zero degree phase relationship between $\phi_1$ and $\phi_3$. Gate 30 also receives the negative pulse generated by differentiator 20, but, as will be described below, this pulse has no effect on flip-flop 18.

Assume that just prior to the time designated as $t_0$ in FIG. 5 both flip-flops are reset. The D input to flip-flop 18 is low. At time $t_0$ the oscillator signal undergoes a positive transition and flip-flop 14 is clocked set. Differentiator 20 generates a negative-going pulse which appears after inversion by gate 30 at the clock input of flip-flop 18. This pulse does not change the state of the flip-flop as the flip-flop is reset and the D input is low. The change in state of flip-flop 14 at $t_0$ is delayed by network 16 from appearing at the D input of flip-flop 18. Thus, the pulse generated by differentiator 20 has no effect on the state of flip-flop 18.

At time $t_0$ differentiator 22 also generates a pulse which is wider than the pulse generated by differentiator 20. The trailing edge of the pulse generated by differentiator 22 occurs after the delay of network 16 has timed out. Therefore, by the time designated as $t_1$ in FIG. 5, the D input of flip-flop 18 has become high to follow the change in flip-flop 14 which has occurred at time $t_0$. The negative pulse generated by differentiator 22 appears at the input to differentiator 28. In response to the trailing edge thereof at time $t_1$, differentiator 28 generates a negative-going pulse. An inverted version of this pulse appears at the output of gate 30 to thereby clock flip-flop 18 set. The $\phi_1$ and $\phi_3$ output signals of the two flip-flops are maintained in a substantially zero degree phase relationship with respect to each other. The output of gate 30 is shown in FIG. 5c.

Upon the next positive-going transition of the oscillator signal at the time designated as $t_2$ in FIG. 5, a similar sequence of events occurs. Flip-flop 14 is clocked reset by the oscillator's signal positive-going transition. The pulse generated by differentiator 20 appears after inversion by gate 30 at the clock input of flip-flop 18 but has no effect thereon as the D input is high and flip-flop 18 is already set. At the time designated as $t_3$ in FIG. 5 an inverted version of the pulse generated by differentiator 28 appears at the clock input of flip-flop 18 and the flip-flop is reset in response thereto. The $\phi_1$ and $\phi_3$ output signals of the flip-flops are shown in FIGS. 5d and 5e, respectively. It should be appreciated that for purposes of illustration the width of the pulses generated by differentiators 20 and 28 have been shown larger than they actually are when compared to the period of the signal generated by oscillator 12. Conventional circuit design techniques allow the pulses generated by differentiators 20, 22 and 28 to have durations which may be in the order of several hundred nanoseconds. These durations are quite short when compared to the period of the signal generated by oscillator 12. Thus, for the condition wherein the ramp signal is greater in amplitude than the error signal, differentiator 28 functions to clock flip-flop 18 to follow the latest state of flip-flop 14 and thereby maintain a substantially zero degree phase relationship between the Q outputs of the flip-flops.

It is to be understood that the description of this preferred embodiment is intended to be only illustrative, rather than exhaustive, of the present invention. Those of ordinary skill will be able to make certain additions, deletions, and/or modifications to embodiments of the disclosed subject matter without departing from the spirit of the invention or its scope, as defined by the appended claims.

What is claimed is:

1. A circuit for generating as a function of the amplitude of a d.c. control signal at least two periodic output signals having a phase relationship controllable between zero and 180 degrees, said circuit comprising:
   (a) oscillator means for generating a periodically recurring signal of predetermined frequency and waveform said signal having during each period a first portion of first predetermined amplitude and a second portion of second predetermined amplitude;
   (b) means responsive to said oscillator means signal for generating a periodically recurring signal having a ramp waveform said ramp starting each time said first portion of said oscillator signal begins;
   (c) means for comparing said ramp signal to said d.c. control signal said comparison means generating a signal having a first amplitude when said d.c. control signal exceeds said ramp signal and a second amplitude when said ramp signal exceeds said control signal;
   (d) first output means responsive to the beginning of said first portion of said oscillator signal for generating one of said periodic output signals;
   (e) means responsive to the periodic output signal generated by said first output means for generating a delayed version thereof; and
   (f) second output means responsive to said signal generated by said comparator means and said signal generated by said delay means for generating when said comparator means signal changes from said first amplitude to said second amplitude the other of said periodic output signals whereby the phase relationship between said periodic output signals is controlled as a function of said d.c. control signal to be between zero and 180 degrees.

2. The circuit of claim 1 wherein said ramp generating means includes means responsive to said oscillator signal for generating a periodically recurring signal of narrow width each time said first portion begins.

3. The circuit of claim 2 wherein said second output means includes means responsive to said narrow width signal for generating said other output signal when said d.c. control signal is always greater than said ramp signal to thereby control the phase relationship between said periodic output signals at 180 degrees.

4. The circuit of claim 1 further including means responsive to said beginning of said oscillator signal first portion for generating a periodically recurring signal of narrow width said signal having a trailing edge.

5. The circuit of claim 4 wherein said second output means includes means responsive to said trailing edge of said narrow width signal when said comparator means signal is at said second amplitude for generating a periodically recurring signal of narrow width.

6. The circuit of claim 5 wherein said second output means further includes means responsive to said narrow width signal generated by said included means for generating said other output signal when said d.c. control signal is always less than said ramp signal to thereby control the phase relationship between said periodic output signals to be substantially at zero degrees.

7. The circuit of claim 6 wherein said ramp generating means includes means responsive to said oscillator signal for generating a periodically recurring signal of narrow width each time said first portion begins said further includes means responsive to said narrow width ramp generating means signal for generating said other output signal when said d.c. output is always greater than said ramp signal to thereby control the phase relationship between said periodic output signals at 180 degrees.

8. The circuit of claim 2 further including means responsive to said beginning of said oscillator signal first portion for generating a periodically recurring signal of narrow width said signal having a trailing edge.

9. The circuit of claim 8 wherein said narrow width signal generated by said means responsive to said oscillator signal is wider than said narrow width signal generated by said means included in said ramp generating means.

10. The circuit of claim 9 wherein said narrow width signal generated by said means responsive to said oscillator signal is wider than the delay between said one periodic output signal and said delayed version thereof.

11. The circuit of claim 1 wherein said second output means includes means responsive to the change in said comparison means signal from said first amplitude to said second amplitude for generating a periodically recurring signal of narrow width.

12. The circuit of claim 11 wherein said second output means further includes means responsive to said narrow width signal and delay means signal for generating said other output signal having a phase relationship to said one output signal of between zero and 180 degrees.

13. A circuit for generating as a function of the amplitude of a d.c. control signal at least two periodic output signals having a phase relationship controllable between zero and 180 degrees, said circuit comprising:
 (a) oscillator means for generating a periodically recurring signal of predetermined frequency and waveform said signal having during each period a first portion of first predetermined amplitude and a second portion of second predetermined amplitude;
 (b) means responsive to said oscillator means signal for generating a periodically recurring signal having a ramp waveform said ramp starting each time said first portion of said oscillator signal begins;
 (c) means for comparing said ramp signal to said d.c. control signal said comparison means generating a signal having a first amplitude when said d.c. control signal exceeds said ramp signal and a second amplitude when said ramp signal exceeds said control signal;
 (d) first output means responsive to the beginning of said first portion of said oscillator signal for generating one of said periodic output signals and a signal identical to said one output signal said identical signal being at a fixed predetermined delay with respect to said one output signal; and
 (e) second output means responsive to said signal generated by said comparator means and said identical signal for generating when said comparator means signal changes from said first amplitude to said second amplitude the other of said periodic output signals whereby the phase relationship between said periodic output signals is controlled as a function of said d.c. control signal to be between zero and 180 degrees.

14. The circuit of claim 13 wherein said ramp generating means includes means responsive to said oscillator signal for generating a periodically recurring signal of narrow width each time said first portion begins.

15. The circuit of claim 14 wherein said second output means includes means responsive to said narrow width signal for generating said other output signal when said d.c. control signal is always greater than said ramp signal to thereby control the phase relationship between said periodic output signals at 180 degrees.

16. The circuit of claim 13 further including means responsive to said beginning of said oscillator signal first portion for generating a periodically recurring signal of narrow width said signal having a trailing edge.

17. The circuit of claim 16 wherein said second output means includes means responsive to said trailing edge of said narrow width signal when said comparator means signal is at said second amplitude for generating a periodically recurring signal of narrow width.

18. The circuit of claim 17 wherein said second output means further includes means responsive to said narrow width signal generated by said included means for generating said other output signal when said d.c. control signal is always less than said ramp signal to thereby control the phase relationship between said periodic output signals to be substantially at zero degrees.

19. The circuit of claim 13 wherein said first output means includes delay means responsive to said one output signal for generating said identical signal.

* * * * *